(12) United States Patent
Guo

(10) Patent No.: US 7,407,887 B2
(45) Date of Patent: Aug. 5, 2008

(54) NANOSTRUCTURES, NANOGROOVES, AND NANOWIRES

(75) Inventor: Ting Guo, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 206 days.

(21) Appl. No.: 10/966,262

(22) Filed: Oct. 14, 2004

(65) Prior Publication Data

US 2006/0046480 A1 Mar. 2, 2006

Related U.S. Application Data

(60) Provisional application No. 60/512,478, filed on Oct. 16, 2003.

(51) Int. Cl.
*H01L 20/28* (2006.01)
(52) U.S. Cl. .................. 438/682; 438/682; 700/762
(58) Field of Classification Search .............. 438/682, 438/581, 583, 597; 700/721, 762
See application file for complete search history.

(56) References Cited

U.S. PATENT DOCUMENTS

| | | | |
|---|---|---|---|
| 6,413,880 B1 | 7/2002 | Baski et al. | |
| 6,805,904 B2 | 10/2004 | Anders et al. | |
| 6,911,385 B1 * | 6/2005 | Haubrich et al. | 438/610 |
| 2004/0142560 A1 * | 7/2004 | Kuo et al. | 438/682 |
| 2005/0164480 A1 * | 7/2005 | Haubrich et al. | 438/597 |

FOREIGN PATENT DOCUMENTS

JP 2002-076431 3/2002
JP 20020262866 * 3/2002

OTHER PUBLICATIONS

Carter et al, "Growth of self aligned crystalline cobalt silicide nanostructures from nanoparticles", American Chemical Soscety vol. 108.*
Goldfarb et al, reactive deposition epitaxy of CoSi nanoatructures on Si: Nucleation and growth and evolution of dot duirng anneal Ameriacn Physical soceity pp. 4800=4809.*
Zhao et al\,, "Cobalt Silicide Nanocrystal Memory" IEEE 2005, pp. 105-106.*
Kee et al , "Anomalous Growth of Carbon-Coated Nickel Silicide" 2003 IEEE pp. 819-822.*
Ajayan P.M. et al. (Apr. 8, 1993) "Opening carbon nanotubes with oxygen and implications for filling" Nature 362: 522-525.
Alberti, A. et al. (2001) "Structural relationship of polycrysalline cobalt silicide lines to (001) silicon substrate and their thermal stability" Microelectronic Engineering 55: 163-169.

(Continued)

*Primary Examiner*—Savitri Mulpuri
(74) *Attorney, Agent, or Firm*—Morrison & Foerster LLP

(57) ABSTRACT

Compositions and methods for making nanostructures and nanowires on substrates, including but not limited to metal-semiconductor nanostructures and semiconductor nanowires on semiconductor substrates. Particularly described are methods for making cobalt silicide nanostructures on silicon substrates and for making silicon nanowires on silicon substrates using cobalt nanoparticles. Nanogrooves and methods of making nanogrooves. Methods of making silanes.

15 Claims, 9 Drawing Sheets

OTHER PUBLICATIONS

Dass, M. Lawrence A. et al. (Mar. 25, 1991) "Growth of epitaxial $CoSi_2$ on (100)Si" Appl. Phys. Lett. 58 (12): 1308-1310.

Holmes, J. D. et al. (Feb. 25, 2000) "Control of Thickness and Orientation of Solution-Grown Silicon Nanowires" Science 287: 1471-1473.

Hu, J. et al. (1999) "Chemistry and Physics in One Dimension: Synthesis and Properties of Nanowires and Nanotubes" Acc. Chem. Res. 32: 435-445.

Hu, Q. et al. (2003) "High-frequency FTIR absorption of $SiO_2$/Si nanowires" Chemical Physics Letters 378: 299-304.

Iljima, S. and T. Ichihashi (Jun. 17, 1993) "Single-shell carbon nanotubes of 1-nm diameter" Nature 363: 603-605.

Kamins, T.I. et al. (Jan. 13, 2003) "Thermal stability of Ti-catalyzed Si nanowires" Applied Physics Letters 82 (2): 263-265.

Kang, B.S. et al. (2003) "Energetics of ultrathin $CoSi_2$ film on a Si(001) surface" J. Phys. Condensed Matter 15: 67-76.

Kim, H.Y. et al. (2003) "Direct synthesis of aligned silicon carbide nanowires from the silicon substrates" Chem. Commun.: 256-257.

Kluth, P. et al. (2002) "Epitaxial $CoSi_2$-nanostructures: an approach to Si nanoelectronics" Microelectronic Engineering 64: 163-171.

Kong, Y.C. et al. (Jan. 22, 2001) "Ultraviolet-emitting ZnO nanowires synthesized by a physical vapor deposition approach" Applied Physics Letters 78 (4): 407-409/.

Maex, Karen (Nov. 1, 1993) "Silicides for integrated circuits: $TiSi_2$ and $CoSi_2$" Materials Science and Engineering R11 (2-3): 53-153.

Muraka, S.P. (1983) "Silicides for VLSI Applications" Table of Contents. Academic Press: New York: vii-viii.

Puntes, V.F. et al. (Mar. 16, 2001) "Colloidal Nanocrystal Shape and Size Control: The Case of Cobalt" Science 291: 2115-2117.

Reader, A.H. et al. (1992) "Transition metal silicides in silicon technology" Rep. Prog. Phys. 56: 1397-1467.

Rhee, H.S. and B.T. Ahn (May 24, 1999) "In situ growth of an epitaxial $CoSi_2$ layer on a Si (100) substrate by reactive chemical-vapor deposition using a cobalt metallorganic source" Applied Physics Letters 74 (21): 3176-3178.

Su, M. et al. (Jul. 2000) "Lattice-Oriented Growth of Single-Walled Carbon Nanotubes" J. Phys. Chem. B 104 (28): 6505-6508.

Tang, Y.H. et al. (Jan./Feb. 2001) "Si nanowires synthesized from silicon monoxide by laser ablation" J. Vac. Sci. Technol. B 19 (1): 317-319.

Tung, R.T. et al. (May 15, 1983) "Growth of single crystal epitaxial silicides on silicon by the use of template layers" Appl. Phys. Lett. 42 (10): 888-890.

Tung, R.T. et al. (Sep. 1, 1983) "Liquid phase growth of epitaxial Ni and Co silicides" Appl. Phys. Lett. 43 (5): 476-478.

Tung, R.T. et al., eds. (1996) "Silicide Thin Films- Fabrication, Properties, and Applications. Materials Research Society Symposium Proceedings, vol. 402, Boston, MA" Table of Contents, Material Research Society: Pittsburgh: v-xiii.

White, A.E. et al. (Jan. 12, 1987) "Mesotaxy: Single-crystal growth of buried $CoSi_2$ layers" Appl. Phys. Lett. 50 (2): 95-97.

Yan, X.Q. et al. (2003) "$H_2$-assisted control growth of Si nanowires" J. Crystal Growth 257: 69-74.

Written Opinion of the International Searching Authority mailed on Jan. 9, 2007, for PCT Application No. PCT/US04/33888 filed on Oct. 14, 2004, three pages.

* cited by examiner

NANOSTRUCTURES, NANOGROOVES, AND NANOWIRES

RELATED APPLICATIONS

This application claims priority benefit of provisional patent application 60/512,478, filed Oct. 16, 2003, with inventor Ting Guo, and title "Metal-Semiconductor nanostructures," the contents of which is incorporated herein in its entirely.

TECHNICAL FIELD

Described herein are compositions and methods related generally to nanostructures, nanowires, and nanogrooves on substrates, including but not limited to metal-semiconductor or alloy-semiconductor nanostructures and semiconductor nanowires on semiconductor substrates.

BACKGROUND

With the advent of new nanotechnology techniques over the past few years, it is becoming possible to produce materials with nanoscale features that have new and useful optical, electronic, and other properties. For example, nanoscale structures embedded on the surface of a semiconductor or other substrate and made of a material different from the substrate may be useful in a variety of applications including as contacts, interconnects, and gates in nanoelectronics integrated circuit technology; in the formation of advanced transistors from conductive and semiconductor nanostructures; as sensors, especially high temperature sensors; as nanoscale templates for building other nanostructures; as photoluminescent devices; as infrared detectors; as a method of examining crystalline wafers; in the nanofabrication of high density nanostructures of high aspect ratios; as patterned nanostructure catalysts and photocatalysts; as field emission display panels; and for generating optical harmonics from the nanostructures. It is also becoming possible to make other nanoscale structures such as nanowires that may be useful in a variety of applications including as infrared detectors; photoluminescent devices; and patterned detectors and emitter arrays.

Currently, two general methods can be used to make nanostructures on crystalline substrates.

The first method deposits atoms on a substrate and allows them to react with the substrate to make lines of one-atom width. This method is extremely difficult to perform because individual atoms have to be deposited onto the surface. Therefore, the location of those atomic lines is difficult to control. More importantly, the structures so produced are limited in their width and may not possess the required properties, such as being electrical conductors. It is also impossible to form multiple component crystalline wires because the width is only one atom wide.

A second method employs thin film deposition (one-step or multiple-step deposition (Dass et al., 1991 APL), and high energy ion implantation (White et al. 1987 APL)) followed by heating (laser (Tung et al. 1983 APL) or other methods of heating). Depending on the thickness of the films deposited on the substrate, either small particles are formed and then converted into metal silicides (when the substrate is silicon) or the thin films are directly converted into metal silicide films (when the substrate is silicon). Lithography is then used to make micro-structures. There are several drawbacks associate with these thin film methods. First, the location of the structures produced is random, depending on where and how the thin films are broken. For example, thin films may break down into particles of different sizes, which may lead to the production of differently sized structures. Since the average size of thin films determines the structures produced subsequently, extremely thin films are needed to make nanometer sized structures. Second, thin film deposition is usually preformed in high vacuum, making it difficult to operate and more costly. Third, the width of lithographically produced nanostructures is more than tens of nanometers, too large for future nanoelectronics.

These existing methods of making nanostructures have substantial drawbacks in making nanostructures useful in the applications listed above and there is a need for methods of producing nanostructures that are capable of accurately controlling the size and morphology of the nanostructures, producing nanostructures of a variety of sizes, and working without the use of high vacuum.

Several methods have been developed to make nanowires, particularly Si nanowires, and most of them need to provide Si in the gas phase, normally in the form of silane ($SiH_4$). Yan et al. (Jour of Crystal Growth, Vol 257, p69 (2003)) reported the growth of thick (100-200 nm diameter.), short, and straight Si nanowires from $H_2$, $SiH_4$, and Au—Pd alloy films deposited on Si wafers. Hu et al. (Chem. Phys. Lett. Vol 378, p299 (2003)) use high temperature furnace (1350 C) to evaporate Si to form Si nanowires (20-1000 nm in diameter.). Laser ablation of silicon at high temperature furnace (1200 C) has also been used by Tang et al. (J. Vac. Sci. Technol. B 19(1), p317 (2001)) and of silicon and metals by Morales et al. However, the nanowires by laser ablation are highly curved. Silane and Ti catalysts have been used to make Si nanowires by Kamins et al. (Appl. Phys. Lett., Vol 82, p263 (2003)). Au nanoparticles and diphenylsilane are used by Holmes et al. to make Si nanowires (Science, Vol 287, p1471 (2000)). In other cases (e.g. Kim et al. Chem Commun, p256 (2003)), low melting solids such as Ga have been used together with Si substrate and $H_2$ to induce the growth of Si nanowires. Although no silanes are used, this method lacks the control over the locations of the nanowire growth.

These existing methods of making nanowire have substantial drawbacks in making nanowires useful in the applications listed above and there is a need for methods of producing nanowires, particularly Si nanowires, that eliminate the use of silanes and provides control over the location of the growth, and the size and homogeneity of the nanowires grown.

SUMMARY

Described herein are methods of making nanostructures and nanowires that overcome one or more of the drawbacks of the existing methods. Also described are particular nanostructures and nanowires, particularly nanostructures and nanowires made using a silicon substrate. Also described are nanogrooves, methods of making nanogrooves, and methods of making silanes.

In one method, nanostructures may be made on a substrate by maintaining at least a portion of a nanoparticle coated substrate in a reaction temperature range for a reaction time, thereby producing nanostructures on the substrate. The method may also optionally include the step of heating at least a portion of the metal nanoparticle coated substrate in a heating temperature range prior to maintaining in the reaction temperature range. The exact heating and reaction temperature ranges may vary, depending on the size and composition of the metal nanoparticles and the substrate. In one method of making nanostructures, the reaction temperature range is between about 800° C. and about 1200° C. In one method of making nanostructures, the heating temperature range is between about 800° C. and about 1200° C., and the reaction temperature range is between about 800° C. and about 1200° C. The metal nanoparticle coated substrate may be made in a variety of ways, including but not limited to contacting the substrate with a metal nanoparticle composition to give the metal nanoparticle coated substrate.

The substrate may generally be any substrate, including but not limited to a semiconductor substrate. Semiconductor substrates that may be used include but are not limited to silicon, germanium or gallium arsenide. The surface of the substrate coated with the nanoparticles may generally be of any morphology, including but not limited to a crystalline or locally crystalline surface morphology.

The metal nanoparticles (which are also referred to herein as "MNP's" used may generally be any nanoparticles capable of making the nanostructures, including but not limited to nanoparticles comprising a metal or alloy selected from Co, Fe, Ti, Ni, Cr, Mn, Mo, Os, Re, W, Pt, and Au, and alloys or two or more of the foregoing. In one method of making nanostructures, cobalt nanoparticles are used. In one method of making nanostructures, cobalt nanoparticles are used, the reaction temperature range is between about 800° C. and about 1200° C. In one method of making nanostructures, cobalt nanoparticles are used, the heating temperature range is between about 800° C. and about 1200° C., and the reaction temperature range is between about 800° C. and about 1200° C. The nanoparticles may optionally include added impurities, including but not limited to carbon and oxygen.

Regarding the size of the nanoparticles, generally any sized nanoparticles may be used that are capable of making the nanostructures. In one method of making nanostructures, nanoparticles that are approximately spherical and have a diameter between about 1 nm and about 100 nm are used. In another method, nanoparticles having a diameter equal to or less than about 10 nm are used.

Regarding the density of nanoparticles on the nanoparticle coated substrate, generally any density may be used that is capable of making the nanostructures. In one method of making nanostructures, the density of nanoparticles on the nanoparticle coated substrate is between about $10^9$ and about $10^{12}$ nanoparticles per square centimeter.

Regarding the heating conditions, generally any heating temperature range, reaction time and reaction temperature range may be used that are capable of making the nanostructures. In one method of making nanostructures, the reaction time for which the nanoparticle coated substrate is maintained at the reaction temperature is about 2 hours or less. In one method of making nanostructures, the nanoparticle coated substrate is maintained in a reaction temperature range of between about 800° C. and about 1000° C. In one method of making nanostructures, the nanoparticle coated substrate is heated in a heating temperature range of between about 800 C. and about 1000° C., and is maintained in a reaction temperature range of between about 800° C. and about 1000° C. for the reaction time. Other heating and reaction temperature ranges that may be used are described herein, including in the Detailed Description.

The nanoparticle coated substrate may generally be prepared in any manner. In one method of preparing the nanoparticle coated substrate, the substrate is contacted with a metal nanoparticle composition to give the metal nanoparticle coated substrate. The substrate may be optionally cleaned, polished, or cleaned and polished before contacting the substrate with the metal nanoparticle composition. Generally any metal nanoparticle composition may be used capable of producing a nanoparticle coated substrate that yields nanostructures upon heating under the various conditions described herein. The metal nanoparticle composition contains metal nanoparticles, which may generally be any metal nanoparticles as described herein, with composition, geometry and size as described herein. In one method, the nanoparticles in the composition are all of approximately the same size. In another method, the standard deviation of the size of the nanoparticles in the composition is less than or equal to about 20% of the average size of the nanoparticles. In another method, the standard deviation of the size of the nanoparticles in the composition is between about 10% and about 20% of the average size of the nanoparticles.

Regarding the composition of the nanostructures, under certain conditions that are described in more detail in the Detailed Description, the nanostructures produced are made of atoms from the substrate and from the metal nanoparticles. In one method of producing nanostructures made of atoms from the substrate and from the metal nanoparticles, the nanoparticle coated substrate is maintained in a reaction temperature range of between about 800° C. and about 1000° C. for the reaction time.

The geometry of the nanostructures produced may generally be of any geometry capable of being made by the methods described herein. In one method of making nanostructures, the nanostructures are made with a depth of between about 1 nm and about 50 nm, a width of between about 1 nm and about 50 nm, and a length of between about 10 nm and 10,000 nm. In another method of making nanostructures, the nanostructures are made with a depth of between about 15 nm and about 25 nm, a width of between about 2 nm to about 20 nm, and a length of about 30 nm and 500 nm. Other geometries that may be produced are described herein including in the Detailed Description.

In one method, a metal nanoparticle coated substrate is used to make nanostructures on the substrate surface by reacting at least a portion of the metal nanoparticles with the substrate. The metal nanoparticles and substrates that may be used are as described herein, including in the Detailed Description. The metal nanoparticles may be caused to react with the substrate using any method capable of causing the reaction, including but not limited to the heating methods described herein, including in the Detailed Description.

Under certain conditions that are described in more detail in the Detailed Description, the methods described herein produce nanowires that are made of atoms from the substrate. In one method of producing such nanowires, at least a portion of the nanoparticle coated substrate is maintained in a reaction temperature range of between about 1000° C. and about 1200° C. for the reaction time, and for at least a portion of the reaction time the nanoparticle coated substrate is heated in the presence of a reducing material. In one method of making nanowires, the reducing material is a hydrogenating material. In one method of making nanowires, the reducing material is hydrogen. The substrates, metal nanoparticles and metal nanoparticle compositions that may be used in producing nanowires are generally the same as described above for producing nanostructures. Specific substrates and nanoparticles that may be used are described herein, including in the Detailed Description. In one method, a metal nanoparticle coated substrate is used to make nanowires on the substrate surface by reacting the metal nanoparticles with the substrate in the presence of a reducing material. The metal nanoparticles, substrates, and reducing material that may be used are as described herein, including in the Detailed Description. The metal nanoparticles may be caused to react with the substrate using any method capable of causing the reaction, including but not limited to the heating methods described herein, including in the Detailed Description.

Generally, nanowires of any geometry capable of being made by the methods described herein may be produced. In one method of producing nanowires, nanowires are produced having a width of between about 2 nm and about 50 nm, and a length of between about $10^2$ to about $10^8$ nm. Other geometries are described herein including in the Detailed Description.

In one particular method described herein, cobalt silicides nanostructures are produced on a silicon substrate by maintaining at least a portion of a silicon substrate coated with cobalt nanoparticles in a reaction temperature range of between about 800° C. and about 1000° C. for a reaction time. The method may optionally include the step of heating at least a portion of the silicon substrate coated with cobalt nanoparticles in a heating temperature range of between about 800° C. and about 1000° C. prior to maintaining in the reaction temperature range. The nanostructures produced may generally be of any morphology. In one method described herein, the nanostructures are crystalline or substantially crystalline $CoSi_2$. The nanoparticles may optionally include added carbon or oxygen impurities. The silicon substrate coated with cobalt nanoparticles may be made in a variety of ways, including contacting a silicon substrate with a composition of cobalt nanoparticles to give the nanoparticle coated substrate. Various characteristics of the composition of cobalt nanoparticles that may be used are described elsewhere herein, including in the Detailed Description. In one version of the methods described in this paragraph, the reaction time is about 2 hours or less. In one method, the nanoparticles are approximately spherical and have a diameter between about 2 nm and about 15 nm. In another method, the nanoparticles used have a diameter between about 2 nm and about 5 nm. In another method, the nanoparticles used have a diameter between about 8 nm and about 14 nm. Other characteristics of the cobalt nanoparticles that may be used are described elsewhere herein, including in the Detailed Description. In one method, the density of nanoparticles on the nanoparticle coated substrate is between about $10^9$ and about $10^{12}$ nanoparticles per square centimeter. Methods described in this paragraph can be used to make cobalt suicide nanostructures with a depth of between about 1 nm and about 50 nm; a width of between about 1 nm and about 50 nm; and a length of between about 30 nm and 10,000 nm. Other geometries may also be made as are described herein, including in the Detailed Description. In one method, a cobalt nanoparticle coated silicon substrate is used to make cobalt silicide nanostructures on the silicon substrate surface by reacting at least a portion of the cobalt nanoparticles with the silicon substrate. The cobalt nanoparticles and silicon substrate that may be used are as described herein, including in the Detailed Description. The cobalt nanoparticles may be caused to react with the substrate using any method capable of causing the reaction, including but not limited to the heating methods described herein, including in the Detailed Description.

In another particular method described herein, silicon nanowires are produced on a silicon substrate by maintaining at least a portion of a silicon substrate coated with metal nanoparticle in a reaction temperature range of between about 1000° C. and about 1200° C. for a reaction time. The method optionally includes the step of heating at least a portion of the silicon substrate coated with metal nanoparticle in a heating temperature range of between about 1000° C. and about 1200° C. prior to maintaining in the reaction temperature range. In this method, the nanoparticle coated substrate is maintained in the reaction temperature range of between 1000° C. and about 1200° C. in the presence of a reducing material for at least a portion of the reaction time. The silicon substrate coated with cobalt nanoparticles may be made in a variety of ways, including contacting a silicon substrate with a composition of cobalt nanoparticles to give the nanoparticle coated substrate. Various characteristics of the composition of cobalt nanoparticles that may be used are described elsewhere herein, including in the Detailed Description. Generally, any reducing materials capable of making the nanowires may be used. In one method, the reducing material is a hydrogenating material. Carbon monoxide may also be used. In one method, the reducing material is hydrogen gas. Generally, any metal nanoparticles may be used that capable of making the nanowires using the methods described in herein. In one method, the nanoparticles are made of a metal or alloy selected from Co, Fe, Ti, Ni, Cr, Mn, Mo, Os, Re, W, Pt, and Au, and alloys or two or more of the foregoing. In one method, cobalt nanoparticles are used. Generally, nanoparticles of any geometry may be used that are capable of making the nanowires using the methods described herein. In one method, the nanoparticles are approximately spherical and have a diameter between about 1 nm and about 100 nm. In another method, the nanoparticles have a diameter equal to or less than about 10 nm. Generally, the geometry and morphology of the silicon nanowires produced is any geometry and morphology capable of being produced using the methods described herein. In one method, the silicon nanowires produced have a width of between about 2 nm and about 50 nm and a length of between about $10^2$ to about $10^8$ nm. In one method, the silicon nanowires are substantially amorphous. In one method of making the silicon nanowires, the density of nanoparticles on the metal nanoparticle coated substrate is between about $10^9$ and about $10^{12}$ nanoparticles per square centimeter. In one method, a metal nanoparticle coated silicon substrate is used to make silicon nanowires on the substrate surface by reacting the metal nanoparticles with the silicon substrate in the presence of a reducing material. The metal nanoparticles, substrate characteristics, and reducing material that may be used are as described herein, including in the Detailed Description. The metal nanoparticles may be caused to react with the silicon substrate using any method capable of causing the reaction, including but not limited to the heating methods described herein, -including in the Detailed Description.

Another method described herein is a method for producing nanogrooves by producing nanostructures on a substrate and contacting the nanostructures with an etching composition capable of preferentially removing nanostructure material as compared to removal of substrate material. The nanostructures can be produced using any method capable of making the nanostructures including any method described herein. In one particular method for making nanogrooves, the nanostructures are made of cobalt silicide and are etched using hydrogen fluoride.

Another method described herein is a method of making a silane composition by heating at least a portion of a metal nanoparticle coated silicon substrate in a reaction temperature range of between about 1000 Celsius and about 1200 Celsius in the presence of hydrogen. One silane composition that can be produced using this method is a monosilane, i.e., $SiH_4$, composition. In one method of making the silane composition, the nanoparticles are made of a metal or alloy selected from Co, Fe, Ti, Ni, Cr, Mn, Mo, Os, Re, W, Pt, and Au, and alloys or two or more of the foregoing. In one method, cobalt nanoparticles are used. Generally, nanoparticles of any geometry may be used that are capable of making the silane composition using the methods described herein. In one method, the nanoparticles are approximately spherical and have a diameter between about 1 nm and about 100 nm. In another method, the nanoparticles have a diameter equal to or less than about 10 nm. In one method of making the silane composition, the density of nanoparticles on the metal nanoparticle coated substrate is between about $10^9$ and about $10^{12}$ nanoparticles per square centimeter. In one method, a metal nanoparticle coated silicon substrate is used to make a silane composition by reacting the metal nanoparticles with the silicon substrate in the presence of hydrogen. The metal nanoparticles, substrate characteristics, and silane compositions that may be used or produced are as described herein, including in the Detailed Description. The metal nanoparticles may be caused to react with the silicon substrate using any method capable of causing the reaction, including but not limited to the heating methods described herein, including in the Detailed Description.

DETAILED DESCRIPTION

Figure 1:
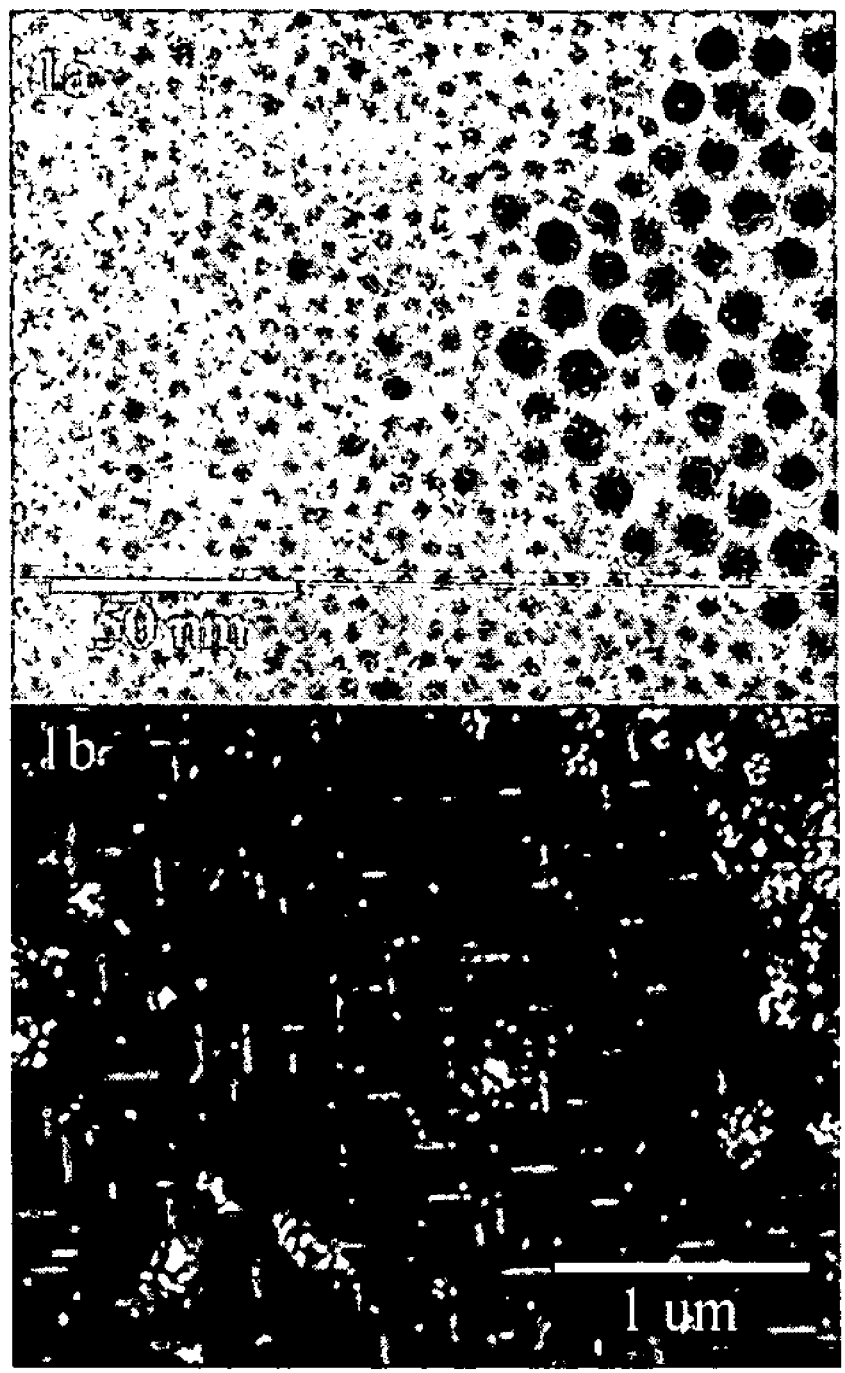
FIG. 1(a) shows a TEM image of MNP's.
FIG. 1(b) shows a TEM image of nanostructures.

Described herein are cobalt-silicon and other metal-semiconductor nanostructures and metal alloy-semiconductor nanostructures and methods of making such nanostructures. Also described are nanostructures on other substrates. Also described are nanowires, including but not limited to silicon nanowires, and methods of making such nanowires; and nanogrooves and methods of making such nanogrooves. Also described are methods of making silanes As described in more detail below, the nanostructures may be made by heating a nanoparticle covered substrate to produce nanoscale features embedded in the substrate surface where the nanoscale features are made of atoms from the nanoparticles and the substrate. Nanogrooves may be formed by removal of the nanostructure material leaving nanoscale indented features in the substrate surface. Under certain conditions, heating of the nanoparticle covered substrate does not result in nanoscale features embedded in the substrate surface and made of atoms from the nanoparticles and the substrate but instead produces nanowires made of the substrate material. The methods for making nanowires may also be used for making silanes.

The electronic and optical properties of the nanostructures, nanowires, and nanogrooves are expected to make them useful in a variety of electronic and optical nanodevices, including but not limited to chemical sensors, nanoelctronic components such as transistors, as contacts, gates, and interconnects in nanoelectronics and molecular electronics, and quantum devices such as nanometer light emitters and detectors.

For example it is expected that nanostructure as described herein may be useful for making contacts, interconnects, and gates in nanoelectronics (integrated circuit technology); forming advanced transistors from conductive and semiconductor nanostructures; making sensors and especially high temperature sensors; making nanoscale templates for building other nanostructures; making photoluminescent devices (nanostructures of different sizes may emit light at different wavelengths); making infrared detectors, since there is expected to be a Schottky barrier between silicide nanostructures (e.g. PtSi) and Si substrate; a method of examining crystalline wafers; nanofabrication of high density nanostructures (nanogrooves, nanostructures, and nanowires) of high aspect ratios (depth-to-width, depth-to-length, and width-to-length); making patterned nanostructure catalysts (for example, $CoSi_2$ (s, nanostructures)+$H_2$ (g)→Co (s)+$SiH_4$ (g)) and patterned nanostructured photocatalysts (for example, $NiSi_2$ for water splitting); making field emission display panels, for example using smaller (sub-10 nm) self-aligned nanostructures; and for optical harmonic generation from the nanostructures.

It is expected that the nanowires produced by the methods described herein may be useful for making infrared detectors, for example it is expected that there will be a Schottky barrier between silicide nanostructures (e.g., PtSi) and a Si substrate; making photoluminescent devices (nanowires of different sizes may emit light at different wavelengths); and making patterned detector and emitter arrays (the location and properties of nanowires depend on the properties and locations of the nanoparticles).

It is expected that the nanogrooves produced by the methods described herein may be useful as templates for building other nanostructures; and in field emission displays.

Because the nanostructures described herein have very small dimensions, and some of them (Co silicide, for example) are expected to be highly conductive whereas others (Fe silicide, for example) are expected to be semiconductors, it is expected that different devices such as transistors and chemical sensors can be made from the nanostructures. Certain of the nanostructures have a large amount of surface atoms along the exposed edge (about 10 to about 30% of the total number of atoms in the nanostructure for 3 nm wide nanostructures) and this may make the nanostructures particularly suitable for chemical sensors. The nanostructures may also be suitable as contacts, gates, and interconnectors in future nanoelectronics. By positioning on the substrate in a specific pattern the nanoparticles used to make the nanostructures (see description of method of making in section below), it is expected that one can control the construction of nanostructures and thus control fabrication of nanodevices.

Certain of the nanostructures described herein are referred to as "self-aligned nanostructures," for which the acronym "SAN's" is used. SAN's are also referred to as SNS's and unless the context makes clear otherwise these two acronyms are used interchangeably. Specific nanostructures are referred to as "Co—Si or metal-semiconductor self aligned nanostructures" or "Co—Si or metal-semiconductor SAN's," or simply as "SAN's." None of these terms are intended to be limiting on the general description of nanostructures as described herein, which are generally described in the section below titled "Nanostructure Composition, Morphology, Dimensions, and Areal Density on Substrate."

In the Examples section below, are presented results for specific examples of the nanostructures and nanowires described herein and specific methods of making such nanostructures. First, however, are described the different general methods of making the nanostructures, different compositions from which the nanostructures may be made, different substrates upon which the nanostructures may be made, different dimensions of the nanostructures, and specific starting materials that may be used in the making of the nanostructures. Also described are nanowires, and methods of making such nanowires; and nanogrooves, and methods of making nanogrooves.

Methods of Making Nanostructures

Generally the nanostructures may be made by heating a metal nanoparticle coated substrate for a reaction time at a reaction temperature or range of reaction temperatures. As described below, the MNP's may be made of pure metals, but may also be made of metals with dopants and may be made of metal alloys. If the nanostructures are required to be used at a temperature other than the temperature at which they are made, the method will also include a step of heating or cooling the nanostructures to the temperature at which they will be used. The metal nanoparticle coated substrate may generally be prepared by any method capable of preparing the coated substrate, including contacting the substrate with a composition containing the metal nanoparticles. Additional steps may optionally be included in the method of making the nanostructures, including but not limited to preparing the substrate for contacting with the MNP's, positioning the MNP's on the substrate once they have been contacted with the substrate, and cleaning and drying the MNP-substrate system before the heating step.

Metal Nanoparticles (MNP's)

The metal nanoparticles used for making the nanostructures may generally be made of any metal and may include additional components in addition to the metal. Metals that may be used include but are not limited to Co, Fe, Ti, Ni, Cr, Mn, Mo, Os, Re, W, Pt, and Au. Other MNP that may be used in the compositions and methods described herein are MNP's made from alloys of two or more metals, including but not limited to alloys made from mixtures of two or more metals selected from Co, Fe, Ti, Ni, Cr, Mn, Mo, Os, Re, W, Pt, and Au. The composition of the MNP's may be used to control lattice mismatch between the nanostructures and the substrate, which it is believed in turn may control the length of the nanostructures.

In addition to the metal or alloy component in the MNP, the MNP may contain additional components including but not limited to impurities that do not substantially change any of the relevant properties of the MNP or resulting nanostructures, and other impurities specifically added to alter the properties of the nanostructures or alter the conditions under which the nanostructures may be made. Such added impurities include but are not limited to carbon and oxygen impurities.

The MNP's may generally be of any size, shape, and morphology that will allow fabrication of the nanostructures. The shape and size of the MNP's used may be but are not limited to approximately spherical MNP with a diameter of between about 1 nm to about 100 nm. In one method of making nanostructures, MNP's with a diameter of less than about 10 nm are used. The MNP may be made using any method known in the art including the methods described in the Examples section. Specific sizes of MNP's that may be used include MNP's with a diameter of between about 3 and about 7 nm and MNP's with a diameter of between about 8 and about 16 nm. It is expected that the yield of nanostructures will decrease as the size of MNP's increases and initial results suggest that use of MNP's with diameters of less than about 5 nm yield growth of nanostructures at the highest yield. The size of MNP's that may be used is not limited to those with diameters less than about 5 nm.

It has been discovered that it is possible to control the size of the nanostructures and areal density of the nanostructures on the substrate by controlling the size of the MNP's used in producing the nanostructures. In some applications it may therefore be advantageous to use MNP's that are all of substantially the same size or a mixture of MNP's with defined size distribution. Populations of MNP's that may be used include but are not limited to a population of MNP's in which the average diameter of a MNP in the population is between about 1 nm and about 5 nm and the standard deviation in the diameter of the MNP's in the population is between about 10% and 20% of the average diameter or a population of MNP's in which the average diameter of a MNP in the population is between about 8 nm and about 16 nm and the standard deviation in the diameter of the MNP's in the population is between about 10% and 20% by length. By way of illustration only and in no way limiting, if the average diameter is 5 nm a standard deviation of 10%-20% of the average diameter could be a standard deviation of 0.5 nm-1 nm.

When the MNP's are Co, the MNP's may be approximately spherical and may have a diameter of between about 1 nm and about 20 nm. In one method of making the nanostructures, Co MNP's with a diameter of between about 2 nm and about 15 nm are used. In another method of making the nanostructures, Co MNP's with diameters of between about 2 nm to about 5 nm or between about 8 nm to about 14 nm are used. The size of the MNP's may be used to control the dimension of the nanostructures.

Substrates

Generally any substrate capable of reacting with the MNP's to produce the nanostructures may be used, including but not limited to semiconductor substrates, which include but are not limited to Si, Ge, GaAs, or substrates with an expitaxial grown layer of other elements, including but not limited to Ti. Generally the substrate may be of any morphology that is capable of reacting with the MNP's to produce the nanostructures, including but not limited to crystalline surfaces and locally crystalline surfaces. If the substrate is crystalline or locally crystalline, the crystal surface may be any crystal surface.

Generally the substrate may be a pure or substantially pure substrate or may be doped with specific dopants that may affect the properties, including but not limited to the electronic and optical properties, of the substrate. By substantially pure, is meant that the substrate may contain accidental impurities but that these were not specifically added and do not substantially change the properties of the substrate. When the substrate is a semiconductor substrate, the substrate may be doped with N or P type dopants, including but not limited to B, P, and N.

In one method of making nanostructures with a Si substrate, the substrate is crystalline or at least locally crystalline. In such case the surface may generally have any crystal plane, including but not limited to the (100) or the (111) plane. When the substrate is Si, the substrate may be pure Si, substantially pure Si, or may be Si doped with dopants, including but not limited to B, P, and N. When the substrate is Si, the substrate may be prepared by any method that may be used to prepare Si substrate surfaces, including but not limited to typical Cz crystal growth method such as that used by Virginia Semiconductor and polished by mechanical and electrochemical methods.

Conditions for Preparing Substrate for Contacting with MNP's

When the metal nanoparticle coated substrate is prepared by contacting the substrate with a metal nanoparticle composition, the substrate may optionally be prepared before contacting with the composition. Generally the substrate may be prepared for contacting with the MNP's using any method capable of preparing the substrate, including but not limited to standard mechanical and then electrochemical polishing of Si bulk crystals. In addition a pristine surface may be used without being specifically prepared for contacting with the MNP's. Surface contamination may be removed using the method described in the Examples. In one version the substrate is cleaned to remove surface contaminants before the MNP's are contacted with the substrate. For example, when the substrate is Si the substrate may be cleaned by various methods including but not limited to immersing in Piranha solution for 10 minutes, washing with deionized water and toluene (99%), and drying in Ar gas.

Conditions for Contacting MNP's with Substrate and Positioning MNP's on Surface

When the metal nanoparticle coated substrate is prepared by contacting the substrate with a metal nanoparticle composition, the MNP composition may generally be contacted with the substrate by any method capable of contacting the MNP composition with the substrate, including but not limited to contacting the substrate with a solution containing the MNP's and sonicating the substrate-MNP system. Other methods such as micro-printing techniques and patterning using AFM, STM, and CFM may be used for depositing MNP's on the substrate. When the MNP's are contacted with the substrate in a solution, the concentration of MNP's in the solution may be any concentration that yields the required areal density of nanostructures on the substrate, including but not limited to concentrations of between about $10^9$ and about $10^{12}$ MNP's/$cm^2$. Solvents that may be used are any solvent capable of containing the MNP's and depositing the MNP's on the substrate, including but not limited to dichlorobenzene and toluene.

Once the MNP's are contacted with the substrate the MNP-substrate system may be washed and dried.

Once the MNP's are contacted with the substrate it may for certain applications be desirable to position the MNP's on the substrate. In this case, the MNP's may generally be positioned using any method capable of positioning the MNP's, including but not limited to use of atomic force microscopes, scanning tunneling microscopes, chemical force microscopes, and micro-printing.

Conditions for Reacting MNP's with Substrate

Once the metal nanoparticle coated substrate has been produced, which may be by contacting the MNP composition with the substrate and subsequent optionally positioning of the MNP's on the substrate if required, the MNP's are reacted with the substrate. In one method, the MNP's are reacted with the substrate by heating the MNP-substrate system for a time and at a temperature or range of temperatures sufficient to produce the nanostructures. In one method, a metal nanoparticle coated substrate is used to make nanostructures on the substrate surface by reacting the metal nanoparticles with the substrate. The metal nanoparticles and substrates that may be used are as described herein. The metal nanoparticles may be caused to react with the substrate using any method capable of causing the reaction, including but not limited to the heating methods described herein.

Heating regimes that may be used include but are not limited to heating the system from its initial temperature (usually room temperature) at a heating temperature or heating temperature range and then maintaining the system at a reaction temperature or in a reaction temperature range for a reaction time. Generally, any reaction time, heating temperature range, and reaction temperature ranges may be used that are capable of producing the nanostructures. In one method the reaction time is between about 1 second and about 2 hours. In one method the reaction temperature range is between about 800° C. and about 1200° C. In one method the reaction temperature range is between about 800° C. and about 1000° C. In one method the reaction temperature range is between about 1000° C. and about 1200° C. In one method the reaction temperature range is between about 700° C. and about 1300° C. In one method the reaction temperature range is between about 600° C. and about 1400° C. In one method the reaction temperature range is between about 500° C. and about 1500° C. In one method the heating temperature range is between about 800° C. and about 1200° C., and the reaction temperature range is between about 800° C. and about 1200° C. In one method the heating temperature range is between about 800° C. and about 1000° C., and the reaction temperature range is between about 800° C. and about 1000° C. In one method the heating temperature range is between about 1000° C. and about 1200° C., and the reaction temperature range is between about 1000° C. and about 1200° C. In one method the heating temperature range is between about 700° C. and about 1300° C., and the reaction temperature range is between about 700° C. and about 1300° C. In one method the heating temperature range is between about 600° C. and about 1400° C., and the reaction temperature range is between about 600° C. and about 1400° C. In one method the heating temperature range is between about 500° C. and about 1500° C., and the reaction temperature range is between about 500° C. and about 1500° C. As used herein "heating in a heating temperature range" or "heating in a reaction temperature range" means that the system being heated is maintained for some amount of time in an environment that is at a single temperature or at a number of different temperatures all of which fall within the specified heating or reaction temperature range. By way of example only and in no way limiting, a system placed in a furnace at 900° for two hours would fall within the definition of "being heated in a reaction temperature range of between about 800° C. and about 1000° C. for a reaction time of about 2 hours." Similarly, a system placed in a furnace at 900° C. for one hour and at 950° C. for the subsequent hour would likewise fall within the definition. Both the range of temperatures and the length of time for which the reaction temperature is maintained may be used for controlling the length of the nanostructures. The heating and reaction steps may be two separate steps or may be combined into one step, in which case the system is maintained in a reaction temperature range for a reaction time sufficient to heat the system and subsequently cause the system to react, thereby producing the nanostructures. In addition, it is expected that the size and the composition of the MNP's may also be used for controlling the dimensions of the nanostructures, including the length of the nanostructures. Without being bound by theory, it is noted that the melting temperature of small MNP's is strongly dependent on the size of the MNP—the smaller the MNP's, the lower the melting temperature—and it may be expected therefore that the narrow nanostructures will grow first from small MNP's, followed by nanostructures formed from the bigger MNP's. Heating can be done using any method capable of producing the desired heating including but not limited to large area heating such as placing the whole substrate in a high temperature furnace, or via localized heating such as employing focused laser beams to raise temperature at desired locations. Generally, any method capable of maintaining the system or any portion of the system in a reaction temperature range for the reaction time may be used for causing the reaction step.

The temperature ranges in which the system is heated and reacted depends on the specific MNP's and substrate used and can be easily determined by conducted a number of runs with different heating and reaction temperature ranges and analyzing the nanostructures produced. For example, in one method using the Co—Si system, the reaction temperature range is between about 800 Celsius and about 1000 Celsius. In another method, the reaction temperature is about 900 Celsius.

Nanostructure Composition, Morphology, Dimensions, and Areal Density on Substrate Generally the nanostructures described herein may be made of a metal or a metal alloy and a semiconductor material and may optionally include additional components. In one version of the structures described herein, the nanostructures are pure or substantially pure. By substantially pure, is meant that the nanostructures may contain impurities that do not substantially effect the properties of the nanostructures and which were not purposefully placed in the nanostructures. Additional components that may be present in the nanostructures may be those additional components added to the MNP's or those additional components added to the substrate. For example, if a semiconductor substrate included an N-type dopant, the resulting nanostructures may contain the N-type dopant. The nanostructures may contain other doped impurities, and may generally contain any impurities for which the lattice distortion is small enough to maintain epitaxial growth. In addition, it may be possible to incorporate dopants into the nanostructure by adding them as an additional component to the substrate-MNP system rather than have the dopant incorporated in the MNP or substrate.

Generally, the nanostructures may be of any stoichiometry allowed under the kinetic and thermodynamic conditions under which the nanostructures were formed, and generally the nanostructures may be of any morphology allowed under the kinetic and thermodynamic conditions under which the nanostructures were formed. Nanostructures that are crystalline or semi-crystalline in nature may be used. It may be possible to make amorphous nanostructures by making crystalline nanostructures and then converting them into amorphous nanostructures. It is expected that amorphous nanostructures will have interesting electronic and optical properties.

In one method when the substrate is Si and the MNP's are Co, the composition of the resulting nanostructures is pure or substantially pure, crystalline $CoSi_2$. Grazing incidence extended x-ray absorption fine structure spectroscopy can be used to verify the structure. Specific dopants that may be incorporated in the $CoSi_2$ nanostructures include but are not limited to C and O.

When present on the substrate, the nanostructures may be of approximately rectangular cross-section. The top of the nanostructures are generally slightly extended above the substrate surface, and may also be flush or substantially flush with the substrate surface and the nanostructure projects into the substrate for a depth of between about 1 nm and about 50 nm. Described herein are nanostructures with a depth of between about 15 nm and about 25 nm. It is expected that it will be possible to control the depth of the nanostructures produced on the substrate by any method capable of controlling the depth including but not limited to controlling the density and size of the MNPs deposited on the substrate and the adhesion force between MNPs and substrate surface. It is expected that control of the adhesion force between the MNP's and the substrate surface can be achieved by modifying the surface with various modification groups including but not limited to various nucleophile terminated (amine) silanes.

The nanostructures may generally have a width of between about 1 nm and about 50 nm, and more particularly may have a width between about 2 nm to about 20 nm. Described herein are nanostructures with a width of between about 3 nm and about 5 nm. It has been found that it is possible to control the width of the nanostructures produced on the substrate by controlling the size and composition of the MNP's. Without being bound by theory, is believed that the size of the MNP's determines the melting temperature of the MNP's and their mobility on surface and this in turn controls the width of the nanostructures.

The nanostructures may generally have a length of between about 10 nm and about 10,000 nm; and more particularly, the nanostructures may have a length of between about 30 nm and about 500 nm. Described herein are nanostructures with a length of between about 65 nm and about 90 nm. It has been found that it is possible to control the length of the nanostructures produced on the substrate by controlling the location of known density and size of uniformly sized MNP's. It may also be possible to control the length of the nanostructures by varying the range of reaction temperatures at which the nanostructures are made, by varying the reaction time, and by varying the composition of the MNP's used to make the nanostructures.

In one version when the nanostructures are made of $CoSi_2$, the nanostructures have a depth of between about 1 nm and about 50 nm, a width of between about 1 nm and about 50 nm, and a length of about 30 nm and about 10,000 nm.

The nanostructures may generally be produced on a substrate with any areal density. It is expected that it is possible to control the areal density of the nanostructures by various methods including but not limited to the dilution of the MNP's stocking solution, the deposition time, and the chemical structure of any surfactants or other chemical modification groups on the MNP's and any surfactants or other chemical modification groups on the substrate.

Nanostructure Electronic and Optical Properties

In light of the known bulk electronic properties of $CoSi_2$, it is believed that $CoSi_2$ nanostructures will have substantially conducting electronic properties, whereas it is believed that iron silicide ($\beta$-$FeSi_2$) will likely have semiconducting electronic properties; although the electronic properties of the nanostructures may be modified from the bulk properties by quantum confinement effects.

Nanowires

Methods of Making Nanowires & Description of Nanowires

It has also been discovered that it is possible to make Si nanowires using methods similar to those described above for making nanostructures. In methods for making nanowires, the metal nanoparticle coated substrate is maintained in the reaction temperature range for a reaction time and for at least a portion of the reaction time the reaction is carried out in the presence of a reducing material. It is expected that nanowires made of other materials may be made in a similar manner to the Si nanowires. For example, if Co MNP's are used in the above described methods for making nanostructures and the heating temperature is about 1100 degrees Celsius, Si nanowires have been made without the use of methane. The dimensions of the Si nanowires made under these conditions are between about 5 nm and about 20 nm in diameter and depending on the reaction time and other exact reaction conditions are expected to be from about microns to about millimeters in length. Experiments have yielded high yield of Si nanowires. The nanowires may generally have any morphology. In one version, the nanowires have an amorphous morphology. The nanowire may also be coated with surface groups, for example Si nanowires may be covered with $SiO_2$.

Generally, it is believed that nanowires with diameters from about 2 nm to about 50 nm may be grown. It is believed that the diameter of the nanowires may be controlled by the size and composition of the MNP's, the growth temperature, the pressure of the back-filled gases, and crystallinity of the substrate. The nanowires can be approximately straight (radius of curvature larger than several hundred nanometers) or may be coiled (radius of curvature smaller than 200 nm).

Generally, it is believed that by following the methods described for production of nanostructures and using different substrates, it may be possible to grow nanowires made of any material from which the substrate is made.

The temperature ranges in which the system is heated and reacted to produce the nanowires is expected to depend on the specific MNP's and substrate used and can be easily determined by conducted a number or runs with different temperature ranges and analyzing the nanowires produced. For example, in one method for producing Si nanowires from the Co—Si system, the heating and reaction temperature ranges are between about 1000 Celsius and about 1200 Celsius. In another method for producing Si nanowires from the Co—Si system, the reaction temperature range is between about 1000 Celsius and about 1200 Celsius. In another method for producing Si nanowires from the Co—Si system, the reaction temperature is about 1100 Celsius. Other reaction temperature ranges and heating temperature ranges that may be used for making nanowires from the Co—Si and other metal nanoparticle coated substrate systems are as follows. Generally, any reaction time, heating temperature range, and reaction temperature ranges may be used that are capable of producing the nanowires. In one method the reaction time is between about 1 second and about 2 hours. In one method the reaction temperature range is between about 800° C. and about 1200° C. In one method the reaction temperature range is between about 1000° C. and about 1200° C. In one method the reaction temperature range is between about 700° C. and about 1300° C. In one method the reaction temperature range is between about 600° C. and about 1400° C. In one method the reaction temperature range is between about 500° C. and about 1500° C. In one method the heating temperature range is between about 800° C. and about 1200° C., and the reaction temperature range is between about 800° C. and about 1200° C. In one method the heating temperature range is between about 1000° C. and about 1200° C., and the reaction temperature range is between about 1000° C. and about 1200° C. In one method the heating temperature range is between about 700° C. and about 1300° C., and the reaction temperature range is between about 700° C. and about 1300° C. In one method the heating temperature range is between about 600° C. and about 1400° C., and the reaction temperature range is between about 600° C. and about 1400° C. In one method the heating temperature range is between about 500° C. and about 1500° C., and the reaction temperature range is between about 500° C. and about 1500° C.

When producing nanowires the reaction is carried out in the presence of a reducing material. The step heating the nanoparticle coated substrate may or may not be carried out in the presence of a reducing material, or may be carried out for some of the reaction time in the presence of a reducing material. The nanoparticle coated substrate is maintained for some reaction time in the range of reaction temperatures and for at least some of the reaction time the reaction is carried out in the presence of a reducing material.

Reducing materials that may be used include but are not limited to hydrogenating materials, including but not limited to hydrogen gas. Other reducing materials that may be used include but are not limited to CO. The reaction may also optionally be carried out in the presence of a buffer gas. Buffer gasses that may be use include but are not limited to Ar gas. Without being bound by theory, it is speculated that when the reducing medium is a hydrogenating material, the reaction of the reducing medium with metal silicide nanostructures produces metal and silanes (hydrosilicons).

Without being bound by theory, it is believed that nanostructures are formed during the nanowire preparation and the nanostructures may behave as precursors in the growth of nanowires.

Nanowires produced by the methods described here may be used in a variety of applications as is known in the art, including but not limited to sensors (for example, after the nanowires are functionalized with different acceptors), light emitters and absorbers (tunable when the nanowires are doped with other elements such as B and P), nanocantilevers, and composite materials.

Without being bound by theory, it is believed that in forming nanowires the nanostructures may be used as catalysts to convert $H_2$ (gas) and Co silicide into silanes (gas at high temperatures (>500 degrees Celsius) and Co metal, which may react with Si further to produce Co silicide again. Therefore, the nanostructures may be acting as catalysts. With silanes, Co alone can catalyze the growth of Si nanowires. It is believed that it may be possible to use nanostructures as catalysts for other applications such as in Fisher-Tropsch reactions that convert $H_2$ (gas) and CO (gas) into hydrocarbons in fuel related applications.

Because it is believed that the properties of the nanowires produced depend on the material and size characteristics of the metal nanoparticles used, it may be possible to grow different nanowires on the same substrate by using metal nanoparticles with different characteristics (diameter, composition, and density) on the same substrate.

When the substrate is silicon and the reducing material is hydrogen gas, the method described herein for making nanowires may also be used as a method for making silanes. Described herein is therefore a method for making silanes, in which a metal nanoparticle coated silicon substrate is heated in a temperature range of between about 1000 Celsius and about 1200 Celsius in the presence of hydrogen, thus producing a composition comprising one or more silanes. In one method of producing silanes, the composition produced comprises monosilane, i.e., $SiH_4$.

Nanogrooves

Methods of Making Nanogrooves & Description of Nanogrooves

It has also been discovered that it is possible to make nanogrooves using the nanostructures described above. For example, it has been found that by etching $CoSi_2$ nanostructures present in a Si substrate with HF it is possible to produce silicon nanogrooves. The geometry and pattern of the nanogrooves will be substantially the same as the geometry and pattern of the nanostructures. For example, etching nanostructures as shown in FIG. 1b or 2b will produce a nanometer sized "tread-deck' like pattern of Si nanogrooves.

It is expected that it will be possible to use the nanogrooves described here as templates to make other materials such as magnetic nanorods via coating or deposition of metals.

Generally, it is expected that nanogrooves may be produced in any substrate in which nanostructures may be made. For example, it is expected that nanogrooves may be made in all substrates listed in the nanostructure section above.

Generally, it is expected that nanogrooves may be made by treating a nanostructure containing substrate with a composition capable of preferentially removing some or all of the nanostructure material from the substrate as compared to removal of the substrate material itself. Generally, it is expected that this nanogroove producing method may be used for on any of the nanostructure-substrate systems described in the nanostructure section above. Examples of chemicals that may be used to preferentially remove the nanostructure material include but are not limited to HF. In addition, it is believed that other etching methods such as plasma etching commonly used in the semiconductor industry can make evenly etched nanogrooves from the nanostructures described herein by better controlling the rate of etching.

Generally, it is expected that the nanogrooves will have geometry similar to that of the nanostructures from which they are produced. However, it is expected that it will be possible to control the depth of a nanogroove by controlling the amount of time for which the nanostructure-substrate system is exposed to the nanostructure removing composition. It is expected to be possible, therefore, to produce nanogrooves with depths from 0 nm up to a depth approximately equal to the depth of the nanostructure from which the nanogroove is produced. The nanogrooves are expected to have widths and lengths in the ranges and geometries described for the nanostructure systems, and to have depths from about 0 nm to about the depth of the nanostructure from which the are produced.

It is possible to use the nanogrooves so produced to inspect nanostructures on Si wafers. Since the nanostructures can be used substrate dependent, the method presented here can be used to examine the quality of the Si wafers, especially their surface quality and composition. For example, since the formation of the nanostructures depend on various characteristics of the Si substrate, and nanogrooves are easy to see under an SEM, the formation of nanogrooves can be used to examine the substrate, particularly the crystallinity of the substrate, whether the substrate has too much of a $SiO_2$ layer, or whether the crystallinity of the substrate is weak.

EXAMPLE 1

Cobalt Silicide Nanostructures on Si Substrates

The following is an example that has been carried out of the sysnthesis of various nanostructures.

A new type of material, exemplified by the formation of 3 nm wide, self-aligned cobalt silicide ($CoSi_2$) nanosutructures that can be used as contacts, interconnects, and gates in future nanoelectronics and devices, is synthesized by reactions of Co metal nanoparticles with Si substrates.

Described herein is the synthesis of a new type of material, the formation of 3 nm wide, self-aligned cobalt silicide ($CoSi_2$) nanostructures from reactions of Co metal nanoparticles deposited on Si substrates at 900° C. The length of these self-aligned silicide varies from 50 nm to a few microns, and their orientation is determined by the crystalline substrate as they form orthorgonally and hexagonally aligned nanostructures on Si (100) and Si (111), respectively. These nanostructures are thermally stable up to 1000° C. in air, and are chemically inert to prolonged treatment with strong acids. These nanostructures can be used to build contacts, interconnects, gates, transistors, and other nanoscale components that are critical to building nanoscale electronic devices and sensors.

One dimensional crystalline materials such as nanowires, including those made of ZnO, GaN, InP, and Si, and carbon nanotubes have been the focus of many studies in the last decade. (1, 2, 3) Challenges arise not only from making those novel materials, but also from manipulating them once they are made. It is thus advantageous to be able to directly grow desired nanostructures on suitable substrates for device fabrication. Such methods are usually called a bottom-up approach. Lithography, which is a top-down approach, can also make nanostructures if crystalline thin films are available. (4, 5, 6) For example, sub-micron cobalt silicide structures have been made using the top-down method. These structures have been studied for use as contacts, gates, and interconnects in future nanoelectronics because they are thermally and chemically stable and are an excellent conductor. (6, 7) However, the dimension of the structures so fabricated using the top-down approach cannot yet compete with the premade nanostructures mentioned above.

Described herein is a chemical method to synthesize a new type of $CoSi_2$ nanostructure with the bottom-up approach. They are uniform cobalt silicide crystalline nanostructures aligned on Si wafers. Described herein is how to make the metal nanoparticle (MNP) catalysts and the synthesis of the nanostructures.

Co metal nanoparticles were made following the available procedure. (8) 0.54 g of $Co_2(CO)_8$ was dissolved in 3 mL of oxygen-free anhydrous dichlorobenzene (DCB) in a dry box. The solution was then injected into a surfactant mixture, including oleic acid (OA), trioctylphosphine oxide (TOPO), and trioctylamine (TOA), at a temperature slightly above the boiling point of DCB under Ar. After several minutes, portions of the solution were withdrawn from the reaction flask and placed in Ar-filled vials. Depending on the ratios of the surfactants, different sized Co nanoparticles were made, and their sizes were verified by transmission electron microscopy (TEM).

FIG. 1a shows a TEM image of MNP under a condition that favors the growth of 12-nm MNP. Smaller nanoparticles are also present. The large ones have an average diameter of 12±1.2 nm and the small ones 4.4±0.5 nm.

Deposition of the nanoparticles on Si substrates was carried out in air. A solution containing MNP was diluted (from 10:1 to 100:1) in DCB in the dry box, and clean Si substrates were immersed in the diluted solution for several minutes under sonication. The Si substrates were cleaned in Piranha solution (4:1 $H_2O_2$ (30% in water) and $H_2SO_4$ (conc)) for 10 minutes before deposition, and deionized water and DCB were used to wash the deposited substrates. Undoped (100) and (111), and highly B- and P-doped (100) substrates were used.

The MNP coated Si substrates were placed in a high temperature tube furnace (Lindburg/Mini-Mite™) for the nanostructure synthesis. Ar, $H_2$ and $CH_4$ gases were used. Growth time varied from less than 1 sec to 2 hours. After the growth, the furnace was cooled to room temperature, and samples were examined with TEM, scanning electron microscopy (SEM), and atomic force microscopy (AFM).

FIG. 1b shows an SEM image of a typical nanostructure sample. To prepare this sample, diluted (100:1 in DCB) 5-nm Co nanoparticle solution and undoped Si (100) were used. The growth temperature was 1000° C. Two lengths of nanostructure are visible: the medium (200±20 nm) and short (85±12 nm) nanostructure. Based on the SEM measurements, the width of the nanostructure is less than 6 nm. A few isolated and aggregated Co nanoparticles are also visible. None of the nanostructure have metal catalysts attached to their ends.

FIG. 2a shows the AFM (tapping mode) image of a sample produced under similar conditions. Again, nanostructures of two general lengths are observed. The long nanostructure have an average length of 167±32 nm, and the short ones are 37±2.0 nm. A single wall carbon nanotube (SWNT) is also visible, running across the whole sample. The heights of the nanostructure and the SWNTs, visible in this picture, are 3±0.5 nm and 1.4 nm, respectively.

A few long nanostructures, up to 8 μm in length, with MNP attached were also observed. These long nanostructures have a similar morphology as those observed by Liu and colleagues. (9)

Under optimized conditions, more uniform nanostructure were made. FIG. 2b shows nanostructures made using 12-nm MNP at 900° C. These nanostructures in this sample have an average length of 78±11 nm. The density is 20 nanostructures/μm$^2$, the highest produced to date.

Both N- and P-doped Si (100) substrates were used; and the yields of nanostructures were similar. Nanostructures were found aligned on either (111) or (100) surfaces. On the (111) surface, they are hexagonally aligned, forming either a 60 degree or 120 degree angle between the nanostructures.

Those nanostructures were treated in air at temperatures up to 1100° C. They were stable up to 1000° C. in air for over 2 hours.

Figure 2:
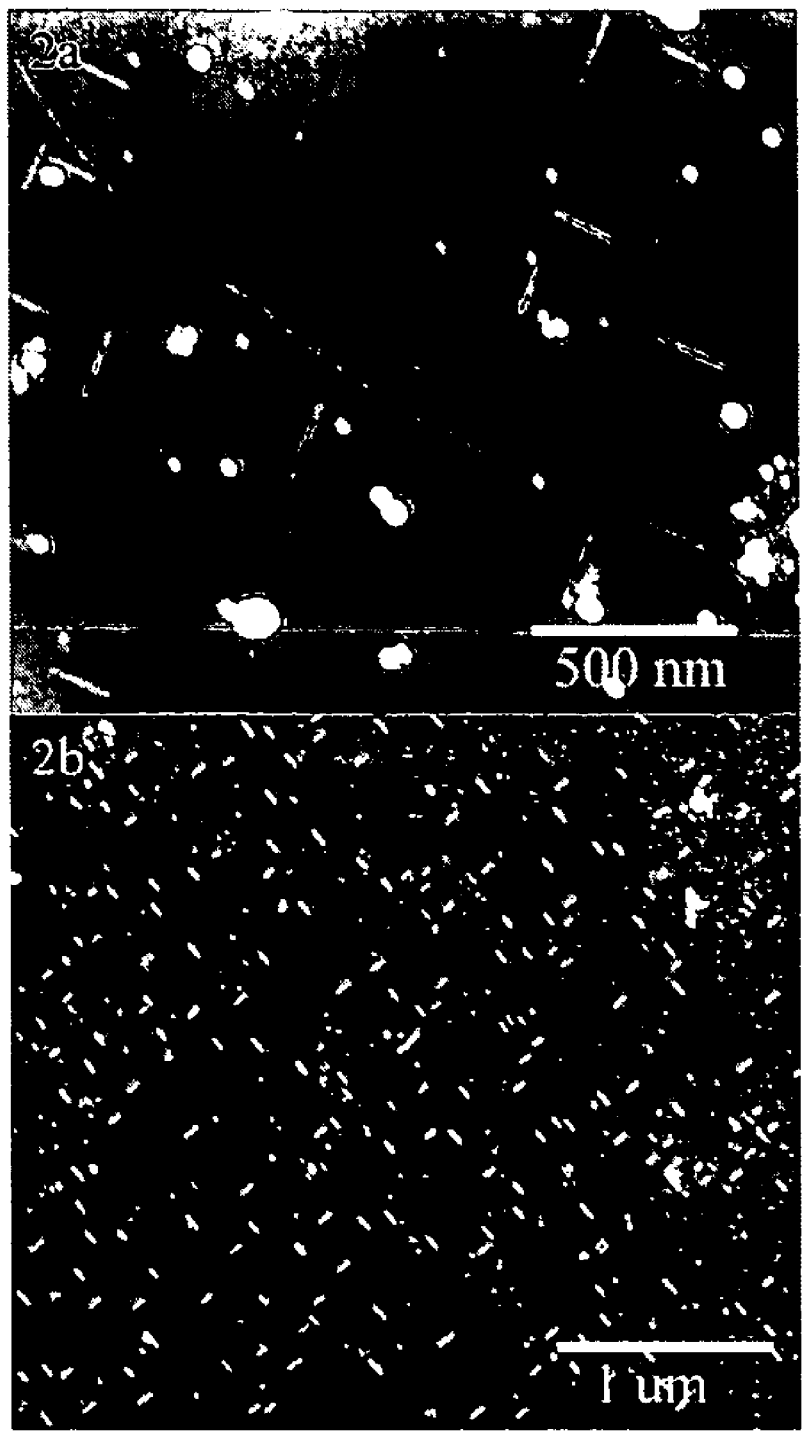
FIG. 2(a) shows an AFM image of MNP's and nanostructures.
FIG. 2(b) shows an SEM image of nanostructures.

Micro Raman spectroscopy using 785 nm light was performed, and a peak at 1600 cm$^{-1}$ (G band) was often observed. However, this signal could come from the SWNTs present in the sample as shown in FIG. 2. No signal from SiC was observed as no peaks at around 800 cm$^{-1}$ were present.

Figure 3:
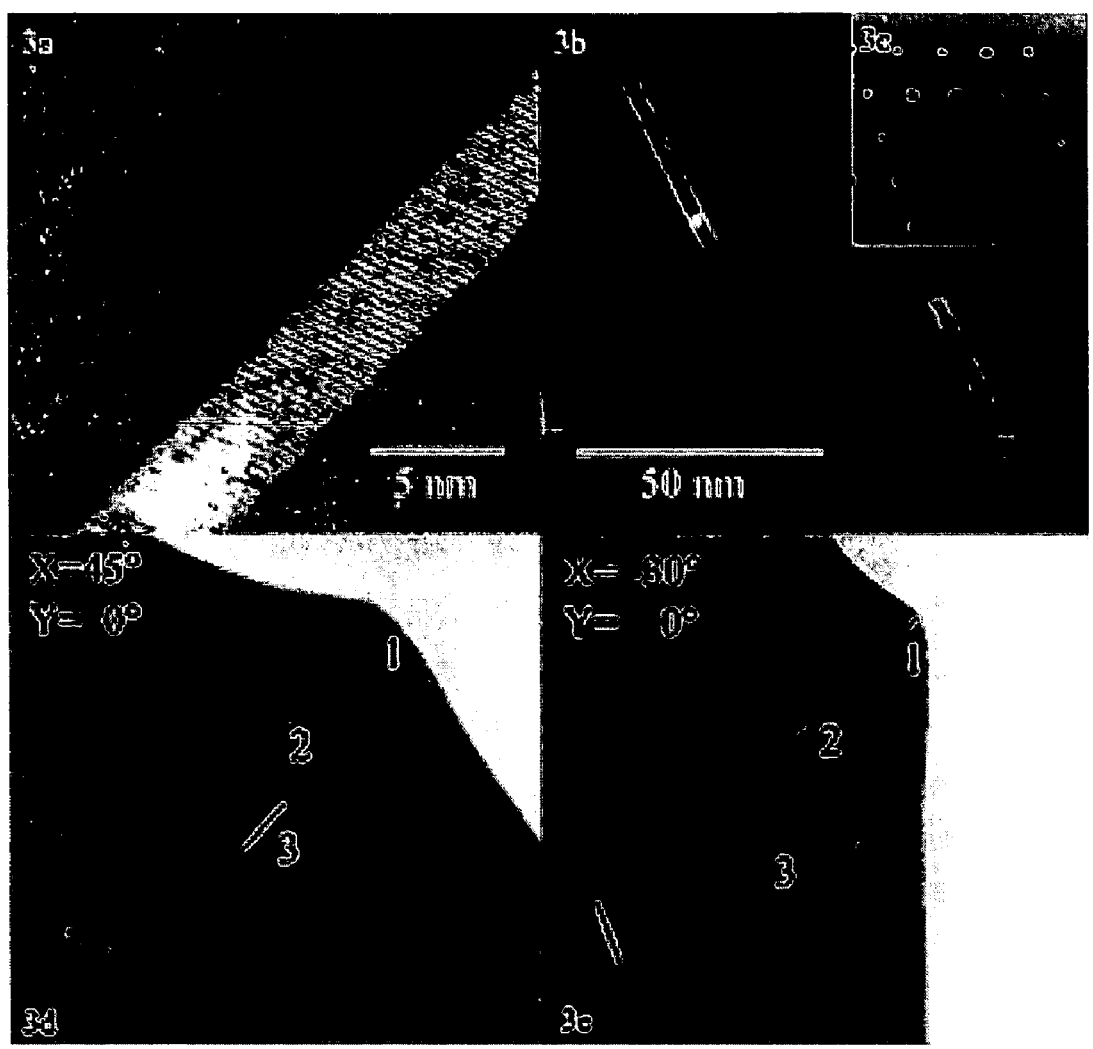
FIGS. 3(a) and 3(b) show TEM images of nanostructures.
FIG. 3(c) shows the electron diffraction pattern of the material shown in FIG. 3(a)
FIG. 3(d) shows an angular dependence TEM measurement of nanostructures taken at +33 degree.
FIG. 3(e) shows the TEM image of the FIG. 3(d) sample taken by rotating 75 degrees along the vertical line.

TEM was used to examine the structure of the nanostructures. Standard dimpling and ion milling techniques were employed. A high resolution TEM image is shown in FIG. 3a. Both the substrate and the nanostructures have clearly resolved lattice fringes, and both fringes have an ~3.8 Å spacing. The surface normal to Si (100) in this figure is not parallel to the e-beam. FIG. 3b shows the two parallel nanostructures, showing they are perfectly aligned. FIG. 3c shows the diffraction pattern of the area shown in FIG. 3a agree with that from the α-Si fcc structure (a=5.428 Å) along the 110 zone axis. The 3.8 Å spacing between the fringes observed in FIG. 3a indicate that it is the (110) plane. No other obvious spots are visible. Thus, the nanostructures are grown along the (110) direction with their edge exposed on Si (100) as shown in FIG. 1-3. This can be explained by the fact that both (100) and (110) of CoSi$_2$ are a good match to Si (100). (6)

Angular dependence measurements were carried out on these nanostructures with TEM (FIG. 3(d-e)). TEM results from two angles are shown. The image shown in FIG. 3d was taken with the sample tilted –30 degrees, rotating around the vertical axis. Some of the nanostructures are narrow, whereas others are broad. The thickness of the narrow nanostructures is 3 nm, the same as that of the nanostructures in FIG. 2a. FIG. 3e shows an image taken at +45 degree tilt angle. Those same narrow nanostructures become broad and the originally broad ones become narrow. This indicates that the nanostructures have a sheet form with only their edges exposed at the surface. The average cross section of those nanostructures is 20 nm (H)×3-nm (W). Since the surface normal to the substrate in these two measurements is not parallel to the e-beam, the overall length looks shorter than the real value. Furthermore, the sheet plane of the nanostructures is parallel to Si (110) and not perpendicular to the Si (100), as shown in FIG. 3a.

The crystalline cobalt silicide CoSi$_2$ (Fm3m) has a lattice constant of 5.365 Å, very close to that of Si of 5.428 Å (Fm3m), thus giving a –1.17% lattice mismatch at room temperature. (10) Crystalline CoSi$_2$ is normally made at ~900° C., the same temperature as the nanostructures in our case, at which the lattice mismatch decreases to 1.05%. In addition, crystalline CoSi$_2$ is also stable in air at up to 1000° C. Other forms of cobalt silicides do exist. However, Co$_2$Si (Pnma) and CoSi (P2i3) have different structures, and both of them are low temperature phases that are more stable at <500° C. (6) Furthermore, these two phases are less stable than CoSi$_2$ when interacting with Si. (11) Although CoSi$_2$ can also be polycrystalline at high temperatures, the nanostructures observed here are single crystalline. Based on these results, it is concluded that the nanostructures are made of CoSi$_2$.

Figure 4:
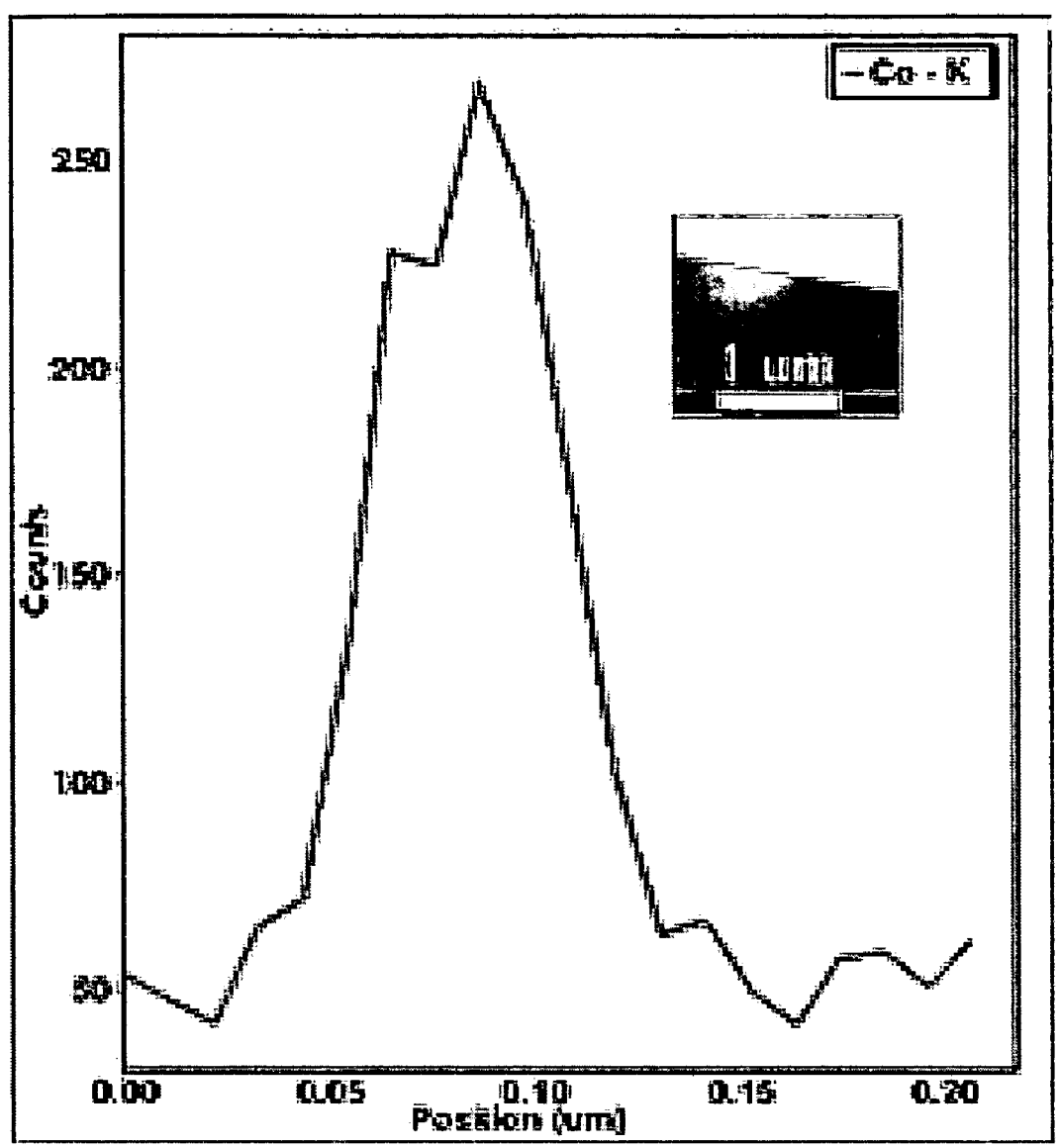
FIG. 4 shows an EDX of a single nanostructure from an ion milled nanostructures sample.

Energy dispersive x-ray spectroscopy on these nanostructures also indicates the presence of Co, as shown in FIG. 4, which shows that the nanostructures contain Co over its entire dimension. The composition of Co in Si is ~2%. The Si signal includes that from the substrate as well as that from the CoSi$_2$ portion. Because the nature of this expitaxial-like growth of CoSi$_2$ on Si, these nanostructures may contain no or only small amounts of carbon and oxygen.

Although the morphology of these nanostructures resemble carbon nanotubes when they are characterized only by SEM and AFM, our results have shown that they are crystalline cobalt silicides. The high yield of these silicides indicates that its growth is much more energetically favorable than the formation of SWNT, which may explain why the yield of SWNT is low. Moreover, presented herein is a new approach for synthesizing a new type of nanostructure on silicon and other substrates. This new approach is afforded by a possibly new energetics that governs the reactions of nanoparticles with the substrate that is different from that that controls the reactions between the bulk thin films and the substrate. In the conventional top-down method of making CoSi$_2$ structures, large amounts of Co (e.g., 20 nm thick layer) are deposited on Si wafers to produce single crystalline CoSi$_2$. (6) A two-step reaction is then employed. First, CoSi is made between the Co—Si interface at 500° C. To guarantee aligned growth of CoSi$_2$, extra Co above the interface is chemically removed before the reaction at a higher temperature is carried out. Second, the temperature is raised to ~700-900° C. to convert CoSi to CoSi$_2$ through Si migration. In our case, due to the limited supply of Co from Co MNP, the mixing of Co with Si may complete quickly, and crystalline CoSi$_2$ is quickly formed when the mixture is treated at 900° C. It is unclear why but worth noting that although the lattices of CoSi$_2$ and Si are closely matched, the boundary between the two phases is well defined around the nanostructures.

Since these nanostructures can be directly fabricated on Si wafers, and they are thermally and chemically stable while being potentially conductive, (12) it is possible to make different$_{devices}$ such as chemical sensors, interconnects between other components, and anchors for building other nanostructures. Our method can also be easily extended to building other types of nanostructures of different elements such as semiconducting crystalline iron silicides. (13) Future work includes a better control over the dimension of the nanostructures, the type of the nanostructures, and the integration of different nanostructures to form more complex devices.

The references cited in this example section include 1. S. Iijima, T. Ichihashi, *Nature* 364, 737-737 (1993); 2. J. T. Hu, T. W. Odom, C. M. Lieber, *Accounts of Chemical Research* 32, 435-445 (1999); 3. Y. C. Kong, D. P. Yu, B. Zhang, W. Fang, S. Q. Feng, *Applied Physics Letters* 78, 407-409 (2001); 4. H. S. Rhee, B. T. Ahn, *Applied Physics Letters* 74, 3176-3178 (1999); 5. P. Kluth, Q. T. Zhao, S. Winnerl, S. Lenk, S. Mantl, *Microelectronic Engineering* 64, 163-171 (2002); 6. A. H. Reader, A. H. Vanommen, P. J. W. Weijs, R. A. M. Wolters, D. J. Oostra, *Reports on Progress in Physics* 56, 1397-1467 (1993); 7. K. Maex, *Materials Science & Engineering R-Reports* 11, 53-153 (1993); 8. V. F. Puntes, K. M. Krishnan, A. P. Alivisatos, *Science* 291, 2115-2117 (2001). 9. M. Su, et al., *Journal of Physical Chemistry B* 104, 6505-6508 (2000). 10. A. Alberti, F. La Via, C. Spinella, E. Rimini, *Microelectronic Engineering* 55, 163-169 (2001); 11. B. S. Kang, S. K. Oh, H. J. Kang, K. S. Sohn, *Journal of Physics-Condensed Matter* 15, 67-76 (2003); 12. S. P. Muraka, *Silicide for VLSI Applications* (Academic Press, New York, 1983); 13. Silicide Thin Films—Fabrication, Properties, and Applications, R. Tung, K. Maex, P. W. Pellegrini, L. H. Allen, Eds., Materials Research Society, Boston, Mass. (MRS, 1995).

EXAMPLE 2

Silicon nanowires have been made using chemical vapor deposition (CVD) and other methods. Generally a vapor source of Si has to be provided. In this example, it is shown that Si nanowires can be made with $H_2$ gas and silicon wafers in the presence of Co nanoparticles.

Figure 5:
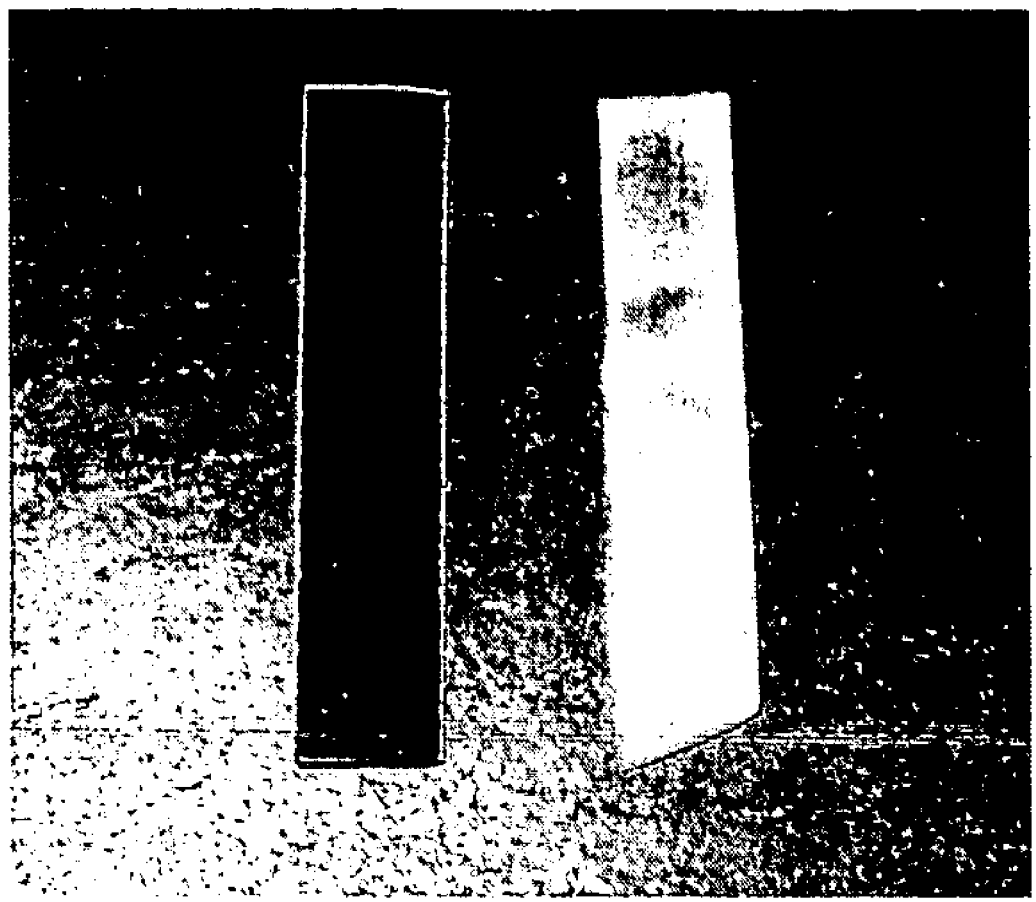
FIG. 5 shows a photograph of ¼"×2" wafers with nanostructures (left) and nanowires (rights).

Si nanowires (SiNW) were made by reacting Co nanoparticles (CoNP) with Si wafers in $H_2$ and Ar gases at 1100° C. The deposition of CoNP was similar to that used in making nanostructures at 900° C. However, the SiNW covered Si wafers are dramatically different from that of nanostructure or unreacted Si wafers, as shown in FIG. 5. The dull color (the wafer on the right) is due to the strong scattering of the SiNW on the substrate. The dimensions of the strips are approximately ¼"×2".

Figure 6A:
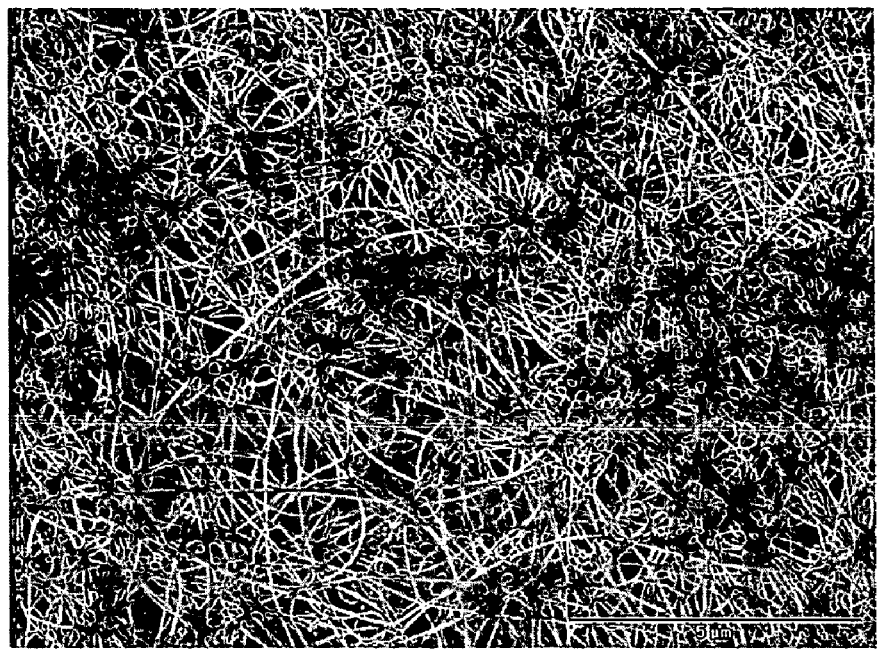
FIGS. 6(a) and 6(b) show SEM images of silicon nanowires.
Figure 6B:
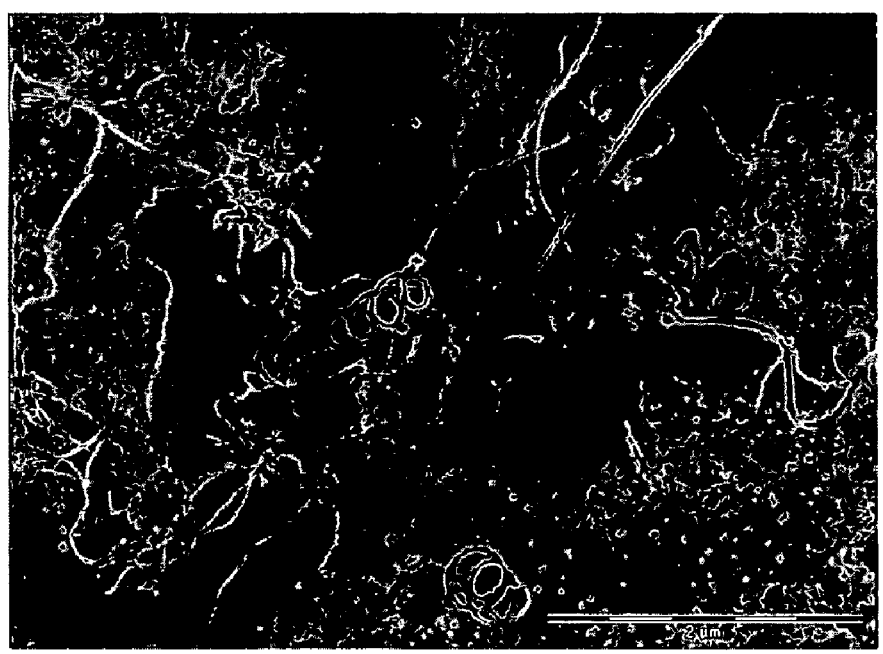

A high resolution SEM picture (FIG. 6(*a*)) shows that those SiNW are 5-50 nm in diameter, with an average diameter of 20 nm. The scale bar in FIG. 6(*a*) is 5μm. Since the ends of SiNW are not easily found, one can estimate that these wires are many microns long. The quality of those wires is high. Since no hydrocarbons were used during the growth, no amorphous carbon is visible on the surface of those SiNW. The density of the wires is high and the thickness of the layer of the SiNW is significant, and the Si substrate is completely blocked by the wires. FIG. 6(*b*) shows coiled SiNW. The scale bar in FIG. 6(*a*) is 2 μm.

Figure 7A:
FIG. 7(a) shows a TEM image of silicon nanowires.
Figure 7B:
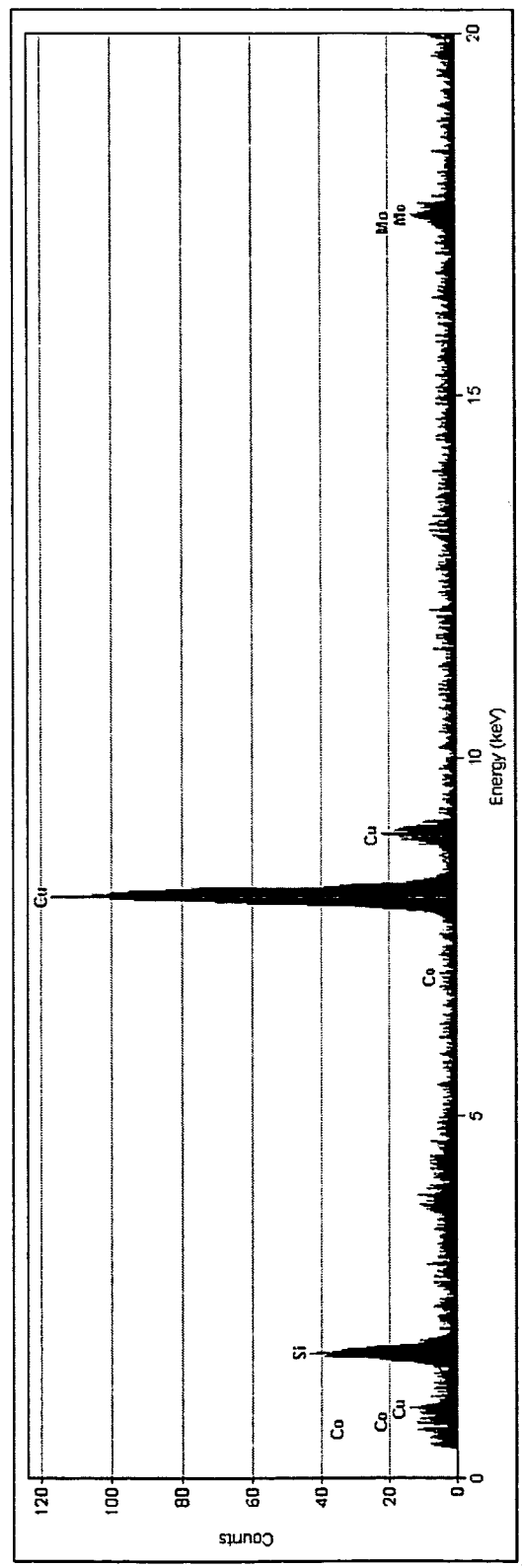
FIG. 7(b) shows the EDX spectrum of the nanowires shown in FIG. 7(a).

Energy dispersive X-ray (EDX) analysis has shown that these wires are made of silicon. FIG. 7 shows a TEM image of the SiNW that were stripped from the Si wafer using a razor blade, and an EDX result on a section of a SiNW deposited on a Lacey carbon TEM grid. The EDX shows pure Si from those wire segments. The Cu signal comes from the Cu in the TEM grids. The spot in FIG. 7(*a*) shows the location of the electron beam. In the TEM image of SiNW in FIG. 7(*a*) the scale bar is 500 nm.

Without being bound by theory, it is speculated that the growth mechanisms are as follows. In this example using $H_2$, since the wire growth does not appear to occur without the use of $H_2$ or CoNP, it is concluded that the growth may occur in the gas phase. More precisely, it may be that Co silicides nanostructures play a role here. They may help convert $H_2$ into $SiH_4$ (gas). The unreacted CoNP may act as catalysts and catalyze the growth of SiNW. This theory postulates a tip growth model with CoNP, and the feedstock is $SiH_4$, which is made in situ.

Figure 8:
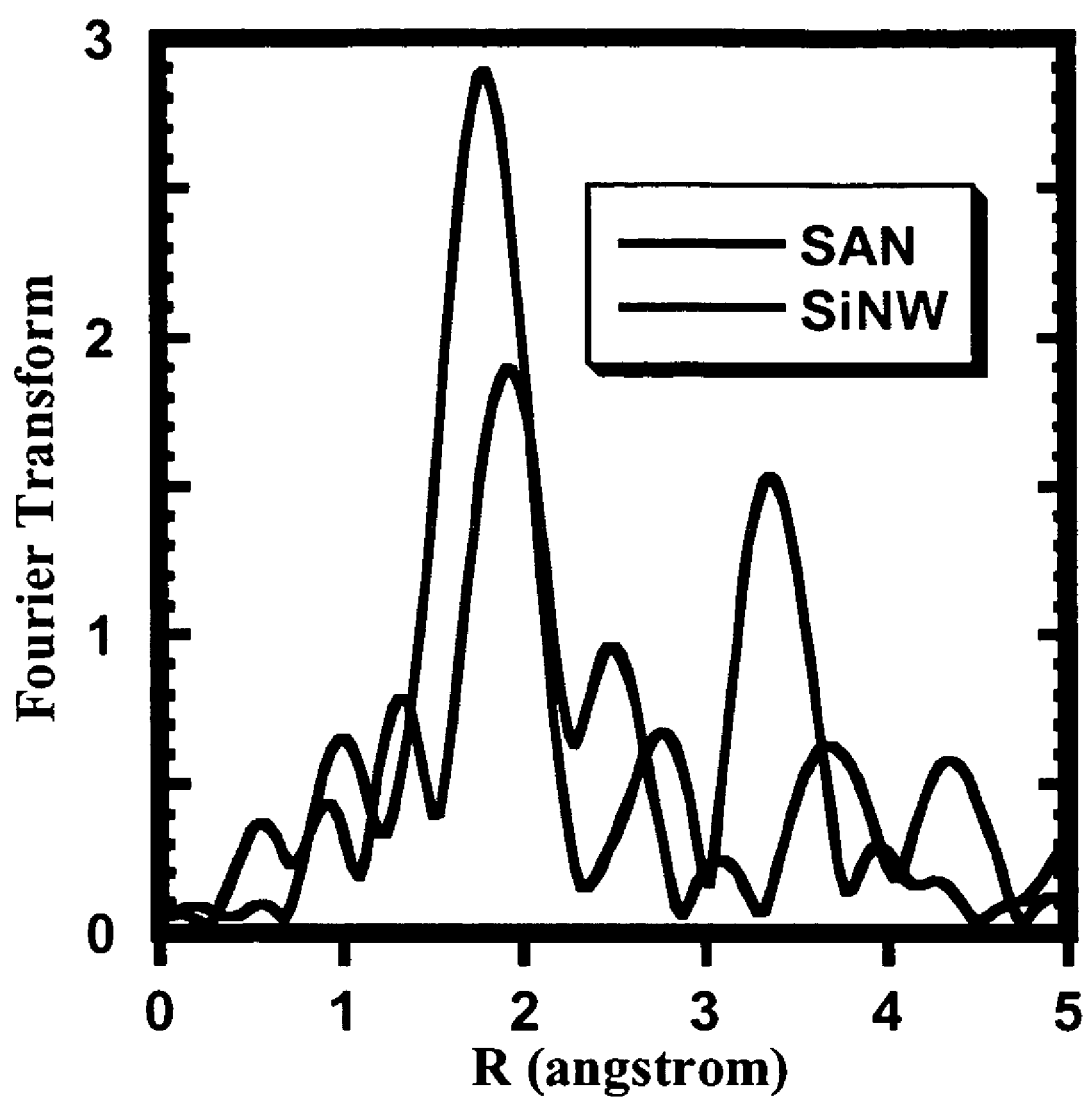
FIG. 8 shows EXAFS results for nanostructures and nanowires after Fourier transformation.

The Co in the SiNW has been investigated with grazing incidence extended x-ray absorption fine structure spectroscopy. The results are shown in FIG. 8. The Co in those wires is different from those in Co silicide nanostructures, which is $CoSi_2$ crystals. The EXAFS analysis shows that Co in SiNW resembles more of CoSi.

The examples and embodiments described in this patent are for illustrative purposes only and that various modifications or changes will be suggested to persons skilled in the art and are to be included within the disclosure in this application and scope of the claims. All publications, patents and patent applications cited in this patent are hereby incorporated by reference in their entirety for all purposes to the same extent as if each individual publication, patent or patent application were specifically and individually indicated to be so incorporated by reference.

The invention claimed is:

1. A method for producing cobalt silicide nanostructures on a substrate, the method comprising heating at least a portion of a cobalt nanoparticle coated silicon substrate comprising a silicon substrate and cobalt nanoparticles in a heating temperature range of between about 700° C. and 1100° C.; and maintaining at least a portion of the nanoparticle coated substrate in a reaction temperature range of between about 700° C. and 1100° C. for a reaction time, wherein the cobalt silicide nanostructures comprise atoms from the silicon substrate and from the cobalt nanoparticles.

2. The method of claim 1, further comprising contacting the silicon substrate with a composition comprising the cobalt nanoparticles to form the cobalt nanoparticle coated silicon substrate.

3. The method of claim 1 wherein the reaction time is about 2 hours or less.

4. The method of claim 1, wherein the cobalt nanoparticles further comprise an added impurity selected from oxygen and carbon.

5. The method of claim 1, wherein the cobalt nanoparticles are approximately spherical and have a diameter of between about 2 nm and about 15 nm.

6. The method of claim 5, wherein the cobalt nanoparticles have a diameter of between about 2 nm and about 5 nm.

7. The method of claim 5, wherein the cobalt nanoparticles have a diameter of between about 8 nm and about 14 nm.

8. The method of claim 2, wherein the cobalt nanoparticles of the composition are a population of approximately spherical cobalt nanoparticles, each cobalt nanoparticle of the population having a diameter; the population of nanoparticles having an average diameter between about 1 nm and about 5 nm; and the standard deviation of the diameters of the cobalt nanoparticles in the population being less than or equal to about 0.2 of the average diameter.

9. The method of claim 2, wherein the cobalt nanoparticles of the composition are a population of approximately spherical cobalt nanoparticles, each nanoparticle having a diameter; the population of nanoparticles having an average diameter between about 8 nm and about 16 nm; and the standard deviation of the diameters of the cobalt nanoparticles in the population being less than or equal to about 0.2 of the average diameter.

10. The method of claim 1, wherein the density of the cobalt nanoparticles on the cobalt nanoparticle coated silicon substrate is between about $10^9$ and about $10^{12}$ nanoparticles per square centimeter.

11. The method of claim 2, further comprising removing surface contaminants from the silicon substrate before contacting the silicon substrate with the composition comprising the cobalt nanoparticles.

12. The method of claim 2, further comprising polishing the silicon substrate before contacting the silicon substrate with the composition comprising the cobalt nanoparticles.

13. The method of claim 1, wherein the cobalt suicide nanostructures comprise crystalline or substantially crystalline $CoSi_2$.

14. The method of claim 13, wherein the cobalt suicide nanostructures have a depth of between about 1 nm and about 50 nm; a width of between about 1 nm and about 50 nm; and a length of between about 30 nm and 10,000 nm.

15. The method of claim 14, wherein the cobalt silicide nanostructures have a length of between about 30 nm and 500 nm.

* * * * *

UNITED STATES PATENT AND TRADEMARK OFFICE
CERTIFICATE OF CORRECTION

PATENT NO. : 7,407,887 B2 Page 1 of 1
APPLICATION NO. : 10/966262
DATED : August 5, 2008
INVENTOR(S) : Ting Guo It is certified that error appears in the above-identified patent and that said Letters Patent is hereby corrected as shown below:

In the Claims:

Column 24, Line 1, Claim 13, delete "suicide" and insert --silicide--.

Column 24, Line 4, Claim 14, delete "suicide" and insert --silicide--.

Signed and Sealed this

Twenty-eighth Day of October, 2008

JON W. DUDAS
*Director of the United States Patent and Trademark Office*